United States Patent [19]

Leveque

[11] Patent Number: 4,944,024
[45] Date of Patent: Jul. 24, 1990

[54] METHOD AND APPARATUS FOR REDUCING NOISE IN A LINKED COMPRESSOR-EXPANDER TELECOMMUNICATIONS SYSTEM

[75] Inventor: James H. Leveque, Ellicott City, Md.

[73] Assignee: AMAF Industries, Inc., Columbia, Md.

[21] Appl. No.: 305,402

[22] Filed: Feb. 2, 1989

[51] Int. Cl.$^5$ ............................................... H04B 1/16
[52] U.S. Cl. .......................................... 455/35; 455/63; 455/296; 455/312; 455/50; 333/14
[58] Field of Search ................... 455/35, 296, 312, 63, 455/50, 72; 370/7; 333/14; 381/106

[56] References Cited

U.S. PATENT DOCUMENTS 3,828,280 8/1974 Dolby ..................................... 455/72
4,642,583 2/1987 Fucito ..................................... 455/72

OTHER PUBLICATIONS

D. M. Russell, Conference=International Broadcasting Convention, Brigheon, England, Sep. 20-23, 1980 (pp. 281-286).

Primary Examiner—Joseph A. Orsino
Assistant Examiner—Kinfe-Michael Negash
Attorney, Agent, or Firm—Birch, Stewart, Kolasch & Birch

[57] ABSTRACT

A method and apparatus for reducing noise fluctuation in a linked compressor-expander (Lincompex) telecommunications system in which an artificial tone signal is injected into a demodulator of the communication system to bias the output toward self quieting. The artificial tone is developed to have a level that is effective below a threshold level of Lincompex demodulation such that during normal communication transmission, the artificial tone has no deleterious effect, while below the demodulation threshold, random noise inputs are effectively biased to a constant level to produce a quieting effect on the demodulator output.

16 Claims, 3 Drawing Sheets

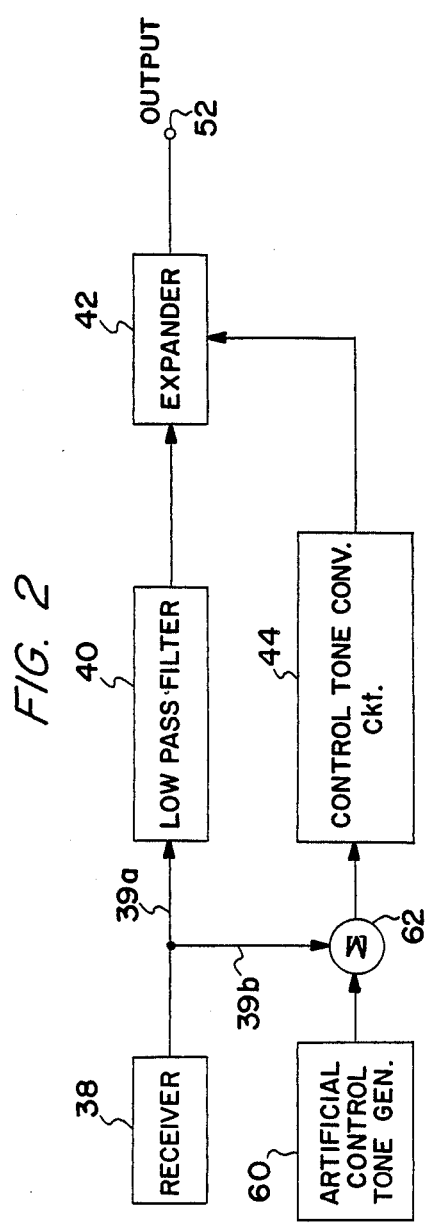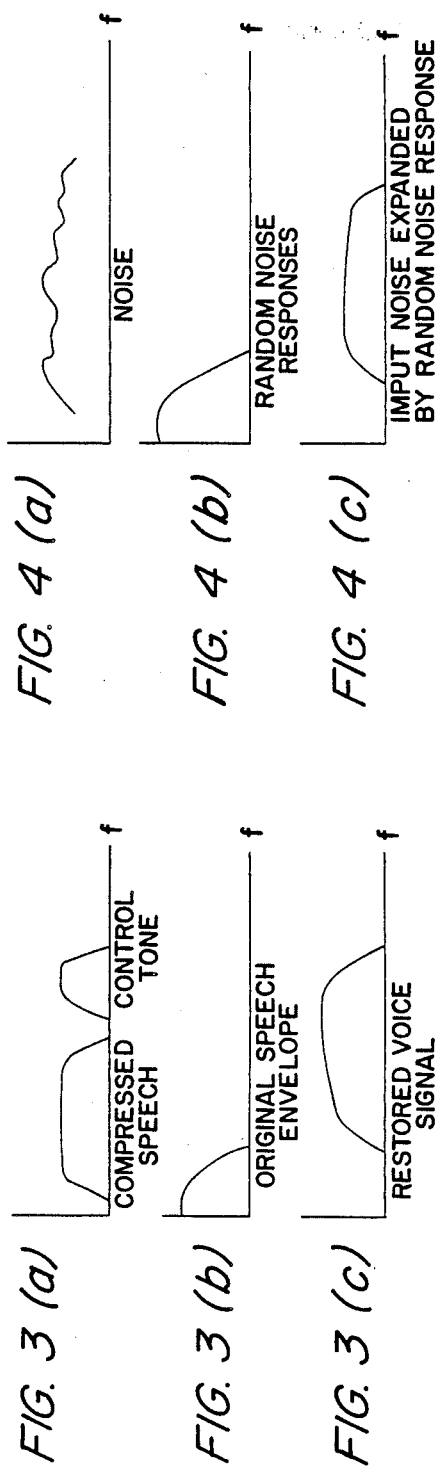

METHOD AND APPARATUS FOR REDUCING NOISE IN A LINKED COMPRESSOR-EXPANDER TELECOMMUNICATIONS SYSTEM

FIELD OF THE INVENTION

The present invention relates to telecommunications systems in general, and more particularly relates to noise reduction in the transmission of any band limited complex waveforms including those representing human speech such as that generated by linked compressor-expander systems (Lincompex) and that generated by parallel-tone or multi-tone data in a system transmitting envelope data separately from compressed signal data.

BACKGROUND OF THE INVENTION

Lincompex systems have generally been known since the early 1960s. These systems were originally implemented with analog technology but now may be implemented digitally such as taught in U.S. Pat. No. 5,271,499 to Leveque, the invention of the present application. U.S. Pat. No. 4,271,499 is incorporated herein by reference.

The basic principles of a Lincompex system as disclosed in the '499 patent will now be described with reference to FIGS. 1(a) and 1(b). Incoming signals are applied to an input terminal 20 and are split into speech signal and control paths 21a and 21b respectively. In the control path 21b, the envelope of the input signal level is detected by an envelope detector 26 and a signal is generated by detector 26 proportional to this detected level. A compressor circuit 22 in the speech path uses the signal from the envelope detector to adjust its gain according to the detected signal level so as to output signals of substantially constant and compressed amplitude. In general implementations, the signal is a voice signal so that the gain of the compressor is adjusted at a syllabic rate. The control path signal is then converted to a logarithmic signal in a logarithmic amplification circuit 28 to compensate for the voltage to decibel conversion which occurs when compressing a voltage signal representing a logarithmic voice signal. The logarithmic signal is applied to a voltage controlled oscillator 30 which produces an output frequency related to the amount of speech signal compression conducted upon the corresponding syllable in the compressor circuit 22. The compressed speech signal and the control frequency signal are then combined in a summer 32, amplified, and input to a transmitter 34 for transmission over a transmission medium 36. The envelope detector 26, logarithmic amplifier 28, and the voltage controlled oscillator 30 form a control tone generator 24.

At the receiving end, a modulated signal is input to a receiver 38 after being transmitted over the transmission medium 36a, and is split back into speech and control signal paths 39a and 39b respectively. The control signal frequency is isolated from the demodulated signal by a band pass filter 46 and the frequency thereof is detected by a frequency demodulator 48. This frequency signal is then passed through a logarithmic to linear network or anti-log amplifier 50 to reattain the speech envelope level signal. The compressed data signal from receiver 38 is passed through a low-pass filter 40 to remove high frequency components. The envelope level signal is then applied to an expander circuit 42 in the speech path which amplifies the compressed signal, back to the original amplitude input signal.

One unresolved problem relating to Lincompex use in a communications network arises when the receiving station demodulator circuitry is in an operative state but no signals are being transmitted by the transmitter. In such a circumstance, the demodulator has only a noise input. Referring to FIG. 1(b), during normal speech transmission, the compressed speech frequency band and the control tone frequency band are as indicated in FIG. 3(a) and are received at receiver 38 of FIG. 1(b) as indicated at (a). The frequency band of the envelope of the original speech signal is shown in FIG. 3(b), while the restored voice signal frequency band is shown in FIG. 3(c). As is apparent, the control tone frequency is used to expand the compressed speech signal to the restored voice parameters as shown in FIG. 3(c) which are output from the expander circuit 42. Reference (b) indicates where the envelope signal, represented by the control tone signal, appears in the control tone conversion circuit 44. With only noise present at the input, as illustrated in FIG. 4(a), random noise responses with a frequency characteristic shown in FIG. 4(b) will be expanded as shown in FIG. 4(c) according to the fluctuations in the noise input as shown in FIG. 4(a). The designations (a), (b) and (c) of FIG. 1(b) apply also to FIGS. 4(a)-4(c). Such random fluctuations of noise at the demodulator are very disconcerting to an operator and are thus undesirable.

SUMMARY OF THE INVENTION

It is thus an object of the invention to reduce random noise level fluctuation in a telecommunications system employing a control tone in the demodulation and recovery of a transmitted data signal.

It is another object of the present invention to reduce the noise fluctuation in a Lincompex communication system used in the transmission of speech or data signals.

These and other objects of the present invention are fulfilled by providing a method of reducing random noise level generation at a demodulator of a Lincompex system comprising the steps of determining a threshold level below which proper Lincompex demodulation does not occur, developing an artificial control tone signal having a level substantially at said threshold level and having a frequency effective to bias random noise level generation at the demodulator to a substantially constant minimum level, and injecting the artificial control tone signal into the demodulator to produce the constant minimum level at an output thereof in the absence of communication signal transmission from a transmitter.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow with reference to the accompanying drawings which are given by way of illustration only, and thus are not limitative of the present invention, and wherein:

FIG. 2 is a block diagram of a demodulator circuit as one embodiment of the present invention in which random noise level fluctuation in the absence of communication signal transmission is reduced;

FIGS. 3(a) to 3(c) are charts illustrating the frequency band content of various signals at different points within the Lincompex system;

FIGS. 4(a) to 4(c) are charts illustrating the frequency content of random noise input to a Lincompex demodulator;

DETAILED DESCRIPTION OF THE PREFERRED EMBODIMENTS

Figure 1A:
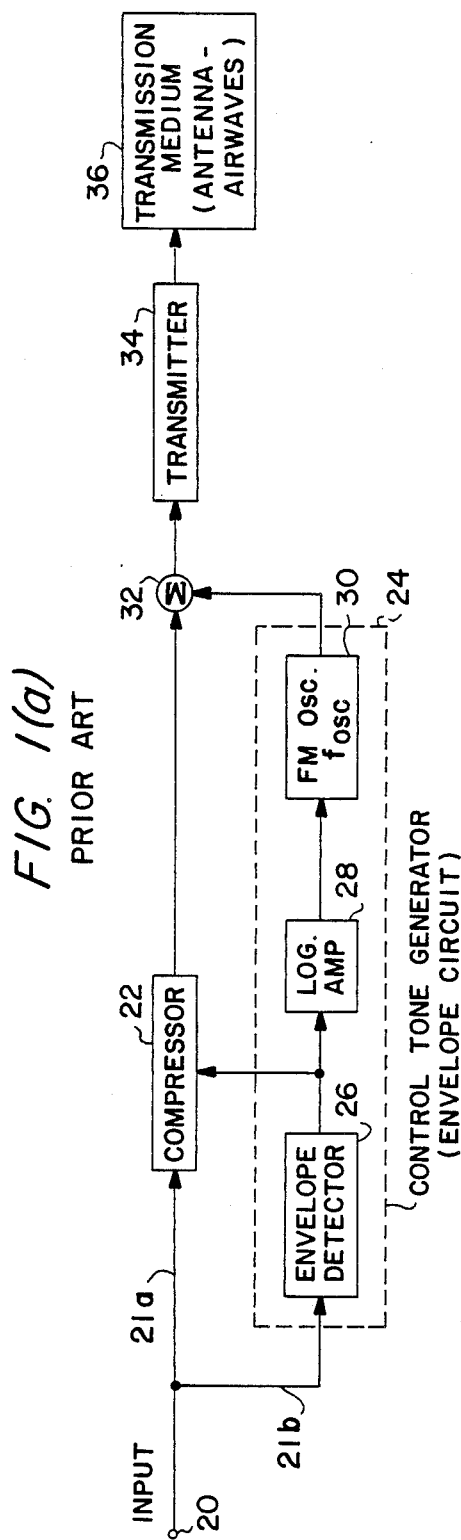
FIGS. 1(a) and 1(b) are block diagrams illustrating a prior art Lincompex compressor and expander circuit respectively.
Figure 1B:
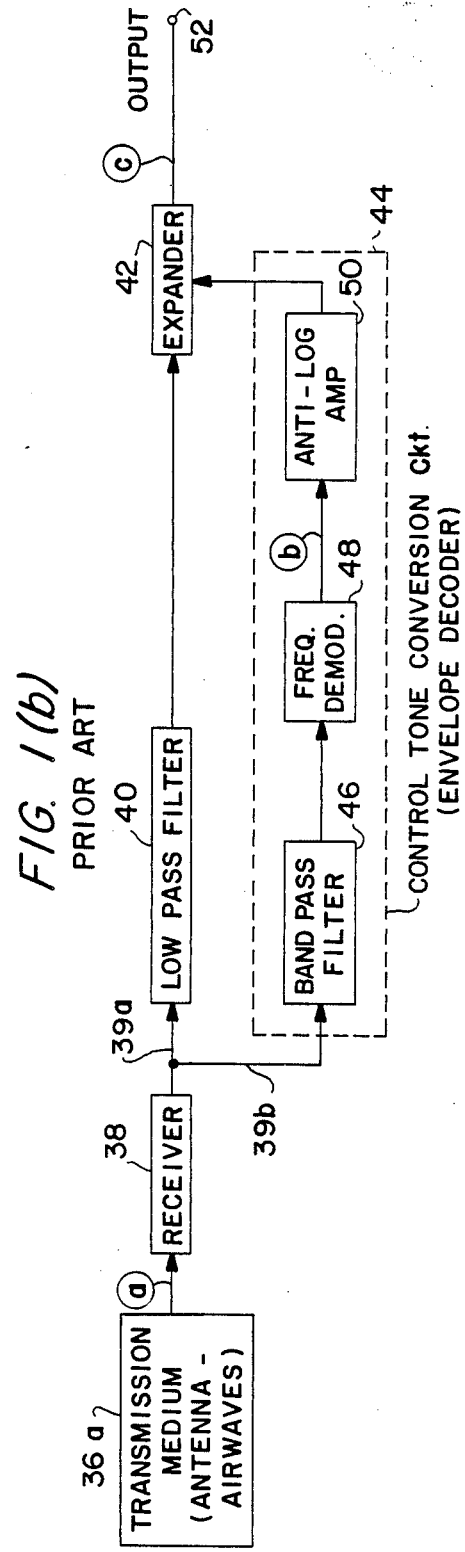

The present invention reduces the effect of random noise fluctuation in the demodulator of the receiving station of a Lincompex system during nontransmission of communication signals by injecting a small amount of artificial tone into the demodulation circuitry to produce quieting of the system. The frequency of this artificial tone should be such that it will produce biasing of noise toward a constant quiet level when no meaningful communication signals are being transmitted. The effective level of this artificial tone signal should be sufficiently small so that at Lincompex transmission threshold and above, (signal levels at which Lincompex demodulation is acceptable) there is no significant detrimental effect on the recovered signal, while the level should be large enough so that below the Lincompex transmission threshold, the biasing effect is produced so that the demodulator unit "self quiets".

As shown in FIG. 2, in a first embodiment of the present invention, the artificial tone is transmitted locally at a low power level from an artificial control tone generator 60, which is added to the signal from the receiver 38 in a summer 62 to be transmitted to the remainder of the control tone conversion circuitry 44. Under circumstances when no speech or communication signal is being received by the receiver 38 or such signal is inadequate, the artificial tone injected into the control tone conversion circuit 44 has a signal level related to the output of the receiver, forcing the control tone conversion circuit to output an expansion factor signal which causes the expander 42 to attenuate random noise to a quiet condition.

Figure 5:
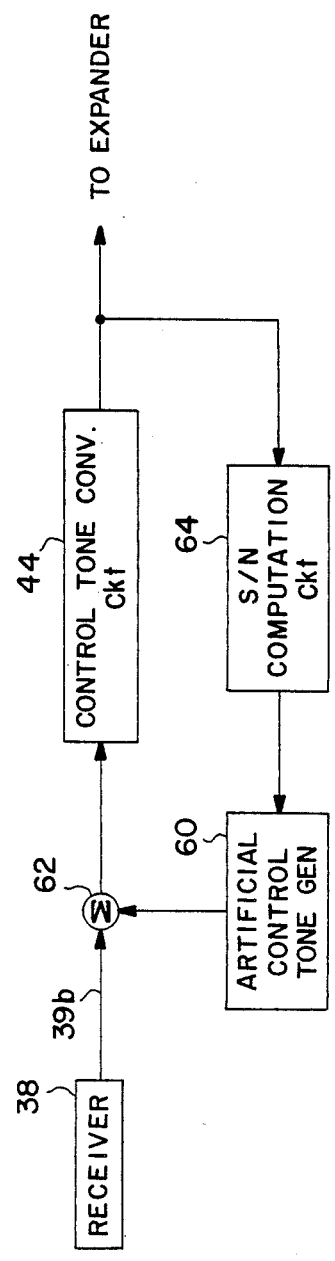
FIG. 5 is a block diagram of a demodulator control tone detector according to a second embodiment of the present invention.

FIG. 5 illustrates a second preferred embodiment of the present invention wherein a signal-to-noise ratio computation network 64 is used to obtain an estimate of the signal-to-noise ratio of the demodulated control tone plus the artificial tone at an output of the control tone conversion circuit 44. The network 64 develops a signal indicative of the computed signal-to-noise ratio to adjust the amplitude of the injected artificial tone from the artificial tone generator 60 in order to maintain a predetermined minimal signal-to-noise ratio. This will achieve a similar biasing toward self quieting as the embodiment of FIG. 2.

The network 64 can be implemented, for example, to measure the average power of the signal at the output of the conversion circuit 44. This can be performed in a number of ways, for example, by measuring the envelope of the control tone and dividing it into the average value of the control tone.

Figure 6:
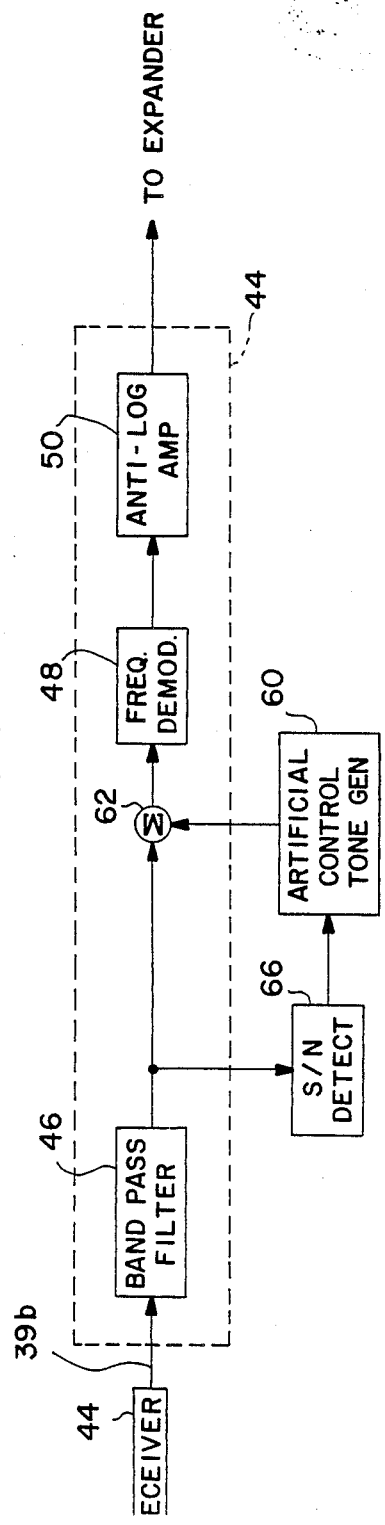
FIG. 6 is a block diagram of a third preferred embodiment of the present invention.

A third preferred embodiment of the invention is illustrated in FIG. 6. In this embodiment, the control tone channel signal-to-noise ratio is detected by a detector circuit 66. The detector develops a signal representative of the signal-to-noise ratio of the control tone channel which is applied to the artificial tone generator 60 to vary the amplitude of the artificial tone in inverse proportion to the detected signal-to-noise ratio to accommodate various noise levels so as to dynamically control the reduction in noise fluctuation according to the actual random noise level input. The detector circuit 66 can be implemented to measure the average power of the signal at the output of bandpass filter 45 similar to the network 64 to obtain the mean noise power and consequently the signal to noise ratio of the control tone channel.

It is to be noted that although an artificial tone frequency is injected into the demodulator of the Lincompex system to achieve the effect of noise reduction, the same effect may also be obtained by applying another type of artificial variable during the subsequent demodulation processing. For example, since the control tone frequency in effect is a variable representative of the transmitted speech envelope, the apparent envelope may be artificially modified during subsequent processing to achieve an effect similar to the use of the artificial tone injection. For instance, the apparent envelope could be decreased nonlinearly at low signal-to-noise ratios.

Finally, since all Lincompex-type systems, whether they be analog, digital, or microprocessor based, use a "control tone" of some type, the features of the present invention will also be applicable to such systems.

The invention being thus described, it will be obvious that the same may be varied in many ways. Such variations are not to be regarded as a departure from the spirit and scope of the invention, but all such modifications as would be obvious to one skilled in the art are intended to be included within the scope of the following claims.

What is claimed is:

1. In a linked compressor expander (Lincompex) communications system transmitting a communication signal comprising a compressed complex waveform and a control tone signal having a frequency representative of the amount of attenuation of said compressed complex waveform over a transmission medium to a receiving station, the method of reducing random noise level generation at a demodulator in the absence of communication signal transmission, comprising the steps of:

determining a threshold level below which Lincompex demodulation is found not to occur;

developing an artificial control tone signal having a level substantially at said threshold level and having a frequency effective to bias random noise level generation at said to a demodulator substantially constant minimum level; and injecting said artificial control tone signal into said demodulator to produce said substantially constant minimum level at an output thereof in the absence of communication signal transmission.

2. The method according to claim 1, wherein said linked compressor expander communications system is an analog system.

3. The method according to claim 1, wherein said linked compressor expander communications system is a digital system.

4. The method according to claim 1, wherein said complex waveform comprises a voice signal.

5. The method according to claim 1, wherein said complex waveform comprises a parallel-tone or multi-tone signal.

6. The method of claim 3 wherein said digital system is a digital signal processor system.

7. In a linked compressor expander (Lincompex) communications system including a modulator for compressing a complex waveform by a predetermined amount, developing a control tone signal having a frequency representative of the amount of compression of said complex waveform, and transmitting said compressed complex waveform and control tone signal over a transmission medium as a communication signal, and a receiving station for receiving said communication signal, demodulating said compressed complex waveform by an amount indicated by said control tone signal, and outputting said demodulated complex waveform, the improvement comprising:

artificial control tone generation means for generating an artificial control tone signal having a level substantially equal to a threshold level below which Lincompex demodulation does not occur, and having a frequency representing a minimal amount of compression; and means for injecting said artificial control tone signal into an input of said demodulator to cause said demodulator to produce a substantially constant minimum expanded signal in the absence of communication signal transmission.

8. In a linked compressor expander communications system as recited in claim 7, wherein said communications system is an analog system.

9. In a linked compressor expander communications system as recited in claim 7, wherein said communications system is a digital system.

10. In a linked compressor expander communications system as recited in claim 7, wherein said complex waveform comprises a voice signal.

11. In a linked compressor expander communications system as recited in claim 7, wherein said complex waveform comprises a parallel-tone or multi-tone signal.

12. A method of reducing random fluctuation of noise generation in a telecommunications system employing a control signal used in the demodulation and recovery of a transmitted complex waveform, comprising the steps of:

determining a threshold level below which demodulation does not occur;

developing an artificial control signal having a level substantially at said threshold level and having a parameter value effective to bias random noise at a receiver of said system to a substantially constant minimum level; and injecting said artificial control signal into an input of said receiver to provide said substantially constant minimum level at an output thereof in the absence of communication transmission.

13. In a telecommunications system employing a control signal used in the demodulation and recovery of a transmitted complex waveform, the improvement comprising:

artificial control signal generation means for generating an artificial control signal at a level substantially equal to a threshold level below which demodulation does not occur, and having a parameter value effective to bias random noise at a receiver of said system to a substantially constant minimum level; and means for injecting said artificial control signal into an input of said receiver to provide said substantially constant minimum level at an output thereof in the absence of a communication transmission sensed by said receiver.

14. A noise reduction system for a linked compressor expander (Lincompex) communications receiving station, comprising:

artificial control signal generation means for generating an artificial control signal at a level substantially equal to a threshold level below which Lincompex demodulation is not found to occur, and having a frequency corresponding to a minimum amount of signal expansion effective to bias random noise at an output of said receiving station to a substantially constant minimum level; and means for injecting said artificial control signal into an input of said receiving station to provide said substantially constant minimum level at said output in the absence of a communication transmission sensed by said receiver.

15. A noise reduction system as recited in claim 14, further comprising:

signal-to-noise ratio detection means for detecting the signal-to-noise ratio of a monitored signal present on a channel in said receiving station carrying a control signal and developing a S/N signal representative thereof; and means for controlling said artificial control signal generation means in response to the S/N signal produced by said signal-to-noise ratio detection means to generate an artificial control signal having a level above a noise level represented by said S/N signal.

16. A noise reduction system as recited in claim 14, further comprising:

signal-to-noise ratio computation means for computing the signal-to-noise ratio of a monitored signal present on a channel in said receiving station carrying a control signal and an injected artificial control signal and developing a S/N signal representative thereof; and means for controlling said artificial control signal generation means in response to the S/N signal produced by said signal-to-noise ratio computation means to generate an artificial control signal having a level above a noise level represented by said S/N signal.

* * * * *